(12) United States Patent
Yang et al.

(10) Patent No.: US 10,727,663 B2
(45) Date of Patent: Jul. 28, 2020

(54) DEVICES AND METHODS FOR FAULT INDICATION CONNECTOR CIRCUITS

(71) Applicant: Eaton Intelligent Power Limited, Dublin (IE)

(72) Inventors: Andrew Yang, Jiangsu (CN); Tom Xiong, Shanghai (CN); Harry Zhang, Shanghai (CN); Alex Zhuang, Shanghai (CN); Jerry Zhang, Shanghai (CN); George Zhang, Shanghai (CN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 399 days.

(21) Appl. No.: 15/716,584

(22) Filed: Sep. 27, 2017

(65) Prior Publication Data
US 2019/0097415 A1  Mar. 28, 2019

(51) Int. Cl.
| | |
|---|---|
| H02H 3/00 | (2006.01) |
| H02H 3/32 | (2006.01) |
| G01R 19/165 | (2006.01) |
| H02H 3/04 | (2006.01) |
| G01R 31/67 | (2020.01) |
| G01R 31/69 | (2020.01) |

(52) U.S. Cl.
CPC ....... *H02H 3/325* (2013.01); *G01R 19/16547* (2013.01); *G01R 31/67* (2020.01); *G01R 31/69* (2020.01); *H02H 3/04* (2013.01)

(58) Field of Classification Search
None
See application file for complete search history.

(56) References Cited

U.S. PATENT DOCUMENTS

| | | | | |
|---|---|---|---|---|
| 4,541,029 A | * | 9/1985 | Ohyama | H02H 7/093 318/430 |
| 5,790,391 A | * | 8/1998 | Stich | H02J 9/062 307/64 |
| 7,050,283 B2 | * | 5/2006 | Field | H02H 9/026 361/103 |

* cited by examiner

*Primary Examiner* — Stephen W Jackson
(74) *Attorney, Agent, or Firm* — Myers Bigel, P.A.

(57) ABSTRACT

An electronic device that is configured to be coupled to an alternating current (AC) power unit that includes an AC input power signal is described. The electronic device includes a reference signal generator circuit that is configured to generate a reference signal based on a direct current (DC) power source, a voltage divider circuit that is configured to scale the reference signal for application to the AC input power signal to generate a divided AC input power signal, an amplifier circuit that is configured to output a fault indication signal responsive to the divided AC input power signal, and an amplifier control circuit that is coupled to the amplifier circuit and is configured to control a fault indication signal level of the fault indication signal that is output by the amplifier circuit. Related methods and computer program products are also described.

18 Claims, 10 Drawing Sheets

LED INDICATORS

| GREEN | RED | YELLOW | FAULT INDICATION |
|---|---|---|---|
| X | X |  | OPEN GROUND |
|  | X |  | OPEN NEUTRAL |
|  |  |  | OPEN HOT |
|  | X | X | HOT/GROUND REVERSED |
| X | X | X | HOT/NEUTRAL REVERSED |
| X |  |  | CORRECT |

DEVICES AND METHODS FOR FAULT INDICATION CONNECTOR CIRCUITS

FIELD

Various embodiments described herein relate to methods and devices for connectors and more particularly to connectors for power circuits.

BACKGROUND

Conventional plugs and/or connectors connect electrical devices and/or loads to an Alternating Current (AC) power source. The AC power connection from the AC power source to the load may include several terminals such as the power signal, i.e., the "hot" terminal, a neutral terminal, and/or a ground terminal. The correct ordering and/or orientation of the wiring of the these terminals in the connector is important in order to prevent damage to the electrical devices or load to which the connector supplies power.

The wiring of the AC power in the connector is typically verified by plugging the connector to a test fixture before plugging the connector to an electrical device or load, to avoid damage to the electrical device or load in the event that the wiring of the AC power in the connector is incorrect. However, plugging into a separate test fixture may be a cumbersome extra step when using power connectors. Furthermore, after testing of the connector is completed, future operation of the connector and general "wear and tear" of the terminals and/or the connector may cause terminals in the connector to detach and/or lose the ability to make a proper connection.

SUMMARY

Various embodiments of the present invention are directed to an electronic device that is configured to be coupled to an alternating current (AC) power unit that includes an AC input power signal. The electronic device includes a reference signal generator circuit that is configured to generate a reference signal based on a direct current (DC) power source, a voltage divider circuit that is configured to scale the reference signal for application to the AC input power signal to generate a divided AC input power signal, an amplifier circuit that is configured to output a fault indication signal responsive to the divided AC input power signal, and an amplifier control circuit that is coupled to the amplifier circuit and is configured to control a fault indication signal level of the fault indication signal that is output by the amplifier circuit.

According to various embodiments, the voltage divider circuit may include a first voltage divider circuit, the amplifier circuit may includes a first amplifier circuit, the amplifier control circuit may includes a first amplifier control circuit, the fault indication signal may include a first fault indication signal, the fault indication signal level may include a first fault indication signal level, and the AC power unit may further include an AC neutral power signal and an AC ground power signal. The electronic device may further include a second voltage divider circuit configured to scale the reference signal for application to the AC neutral power signal to generate a divided AC neutral power signal, a third voltage divider circuit configured to scale the reference signal for application to the AC ground power signal to generate a divided AC ground power signal, a second amplifier circuit that is configured to output a second fault indication signal responsive to the divided AC neutral power signal, a third amplifier circuit that is configured to output a third fault indication signal responsive to the divided AC ground power signal, a second amplifier control circuit that is coupled to the second amplifier circuit and is configured to control a second fault indication signal level of the second fault indication signal that is output by the second amplifier circuit, and a third amplifier control circuit that is coupled to the third amplifier circuit and is configured to control a third fault indication signal level of the third fault indication signal that is output by the third amplifier circuit.

According to various embodiments, the electronic device may include a microcontroller configured to control visual fault indications based on the first fault indication signal level, the second fault indication signal level, and the third fault indication signal level. The visual fault indications may indicate that at least one of the AC input power signal is not connected, the AC neutral power signal is not connected, the AC ground power signal is not connected, the AC input power signal and the AC neutral power signal are interchanged, or that the AC input power signal and the AC ground power signal are interchanged.

According to various embodiments, the electronic device of Claim may include a housing with an interface to the AC power unit, and a plurality of Light Emitting Diodes (LEDs) configured to be illuminated based on one or more of the first fault indication signal, the second fault indication signal, and the third fault indication signal. The electronic device may include a switch configured to interrupt a connection between the AC power unit and a load, based on one or more of the first fault indication signal, the second fault indication signal, and the third fault indication signal.

According to various embodiments, the reference signal generator circuit may include a DC-to-DC power converter configured to convert the DC power source to a scaled voltage source that is input into a reference amplifier configured as a voltage follower to output the reference signal. The electronic device may include a full wave rectifier configured to generate the DC power source from the AC input power signal. In some embodiments, the electronic device may include a current limiting circuit configured to limit a current of the AC input power signal before being applied to the voltage divider.

Various embodiments of the present invention are directed to a method of operating an electronic device that is configured to be coupled to an alternating current (AC) power unit. The method includes generating a reference signal based on a direct current (DC) power source, scaling the reference signal for application to an AC input power signal from the AC power unit to generate a divided AC input power signal, generating a fault indication signal responsive to the divided AC input power signal, and controlling a fault indication signal level of the fault indication signal.

According to various embodiments, the fault indication signal includes a first fault indication signal, the fault indication signal level include a first fault indication signal level. The method may include scaling the reference signal for application to an AC neutral power signal from the AC power unit to generate a divided AC neutral power signal, scaling the reference signal for application to an AC ground power signal to generate a divided AC ground power signal, generating a second fault indication signal responsive to the divided AC neutral power signal, generating a third fault indication signal responsive to the divided AC ground power signal, controlling a second fault indication signal level of the second fault indication signal, and controlling a third fault indication signal level of the third fault indication signal.

According to various embodiments, the method may include controlling visual fault indications based on the first fault indication signal level, the second fault indication signal level, and the third fault indication signal level. The visual fault indications may indicate at least one of the AC input power signal is not connected, the AC neutral power signal is not connected, the AC ground power signal is not connected, the AC input power signal and the AC neutral power signal are interchanged, or the AC input power signal and the AC ground power signal are interchanged.

According to various embodiments, the method may include controlling a plurality of Light Emitting Diodes (LEDs) based on one or more of the first fault indication signal, the second fault indication signal, and the third fault indication signal. In some embodiments, the method may include interrupting a connection between the AC power unit and a load, based on one or more of the first fault indication signal, the second fault indication signal, and the third fault indication signal. In some embodiments, generating the reference signal may include converting the DC power source to a scaled voltage source that is input into a reference amplifier configured as a voltage follower to output the reference signal. The method may include generating the DC power source by applying a full wave rectifier to the AC input power signal. The method may include limiting a current of the AC input power signal before the scaling the reference signal.

According to various embodiments, a computer program product including a tangible non-transitory computer readable storage medium having computer readable program code embodied therein that, when executed by at least one processor, causes the at least one processor to perform any of the operations previously described.

Various embodiments of the present invention are directed to an electronic device that is configured to be coupled to an alternating current (AC) power unit that includes an AC input power signal, an AC neutral power signal, and an AC ground power signal. The electronic device includes a housing comprising an interface to the AC power unit, a reference signal generator circuit that is configured to generate a reference signal based on a direct current (DC) power source, a voltage divider circuit that is configured to scale the reference signal for application to the AC input power signal, the AC neutral power signal, and/or the AC ground power signal to generate divided AC power signals, an amplifier circuit that is configured to output fault indication signals responsive to the divided AC power signals, an amplifier control circuit that is configured to control the fault indication signal levels of the fault indication signals that are output by the amplifier circuit, and a plurality of Light Emitting Diodes (LEDs) coupled to the housing. The plurality of LEDs are controlled based on the fault indication signals.

Further features, advantages and details of the present invention will be appreciated by those of ordinary skill in the art from a reading of the figures and the detailed description of the preferred embodiments that follow, such description being merely illustrative of the present invention.

It is noted that aspects of the inventive concepts described with respect to one embodiment, may be incorporated in a different embodiment although not specifically described relative thereto. That is, all embodiments and/or features of any embodiment can be combined in any way and/or combination. Other operations according to any of the embodiments described herein may also be performed. These and other aspects of the inventive concepts are described in detail in the specification set forth below.

DETAILED DESCRIPTION

Various embodiments will be described more fully hereinafter with reference to the accompanying drawings. Other embodiments may take many different forms and should not be construed as limited to the embodiments set forth herein. Like numbers refer to like elements throughout.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

Connectors are used in various systems to connect an Alternating Current (AC) power source to an electrical device. The electrical device may behave as an electrical load that draws current from the AC power source to the electrical device. A connector that interfaces to the AC power source may include one or more terminals that couple to the AC power source to provide an AC input power signal, also referred to as the "hot" signal, an AC neutral power signal, and/or AC ground power signal to the electrical device powered through the connector. However, defects in the manufacture of these connectors may result in one or more of these terminals being interchanged or not being properly connected, i.e., an open terminal After manufacture of the connector with the terminals for carrying the power signals, the connector may be tested by using an independent test fixture to ensure that all terminals are properly connected. This step may be important to prevent damage to the electrical device from a faulty connector. Additionally, repeated use of the connector may result in the terminals separating from the housing to have an open terminal or shorting of the terminals. Such a failure during the lifetime of the power connector may result in damage to the electrical device to which the connector is supplying power.

Various embodiments described herein may arise from recognition that a fault indication integrated with the connector may be useful in preventing damage to an electrical device that is connected to the AC power supply using the electrical connector. An integrated fault indication in the connector would also be convenient for users since plugging the connector into a separate text fixture would not be necessary.

Figure 1A:
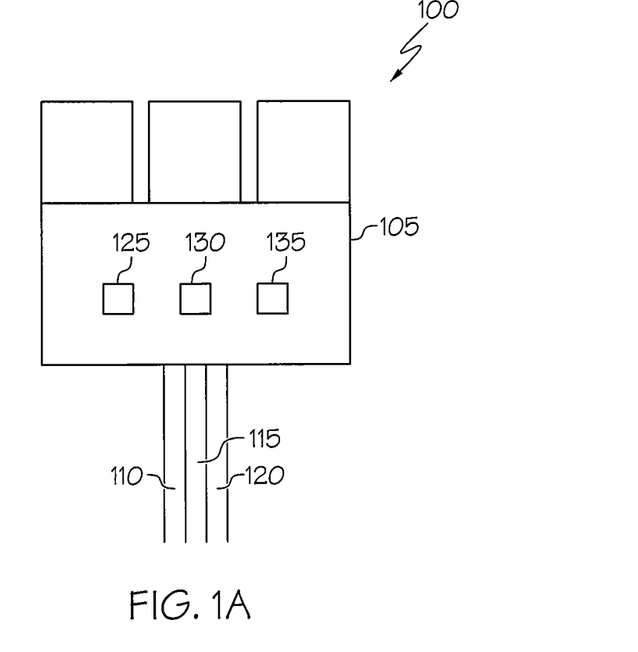
FIG. 1A illustrates an electronic circuit that may be housed in a power connector, according to various embodiments described herein.

FIG. 1A illustrates a connector, according to various embodiments described herein. Referring now to FIG. 1A, an electronic device 100 such as a connector may include one or more AC power lines 110, 115, and/or 120 that carry AC power signals to the housing 105 of the electronic device 100. Housing 105 may be the connector housing for the electronic device 100. The housing 105 includes LEDs 125, 130, and 135 that function as visual fault indicators. Various combinations of these LEDs may indicate open circuits or interchanged connections on the AC power lines 110, 115, and/or 120.

Figure 1B:
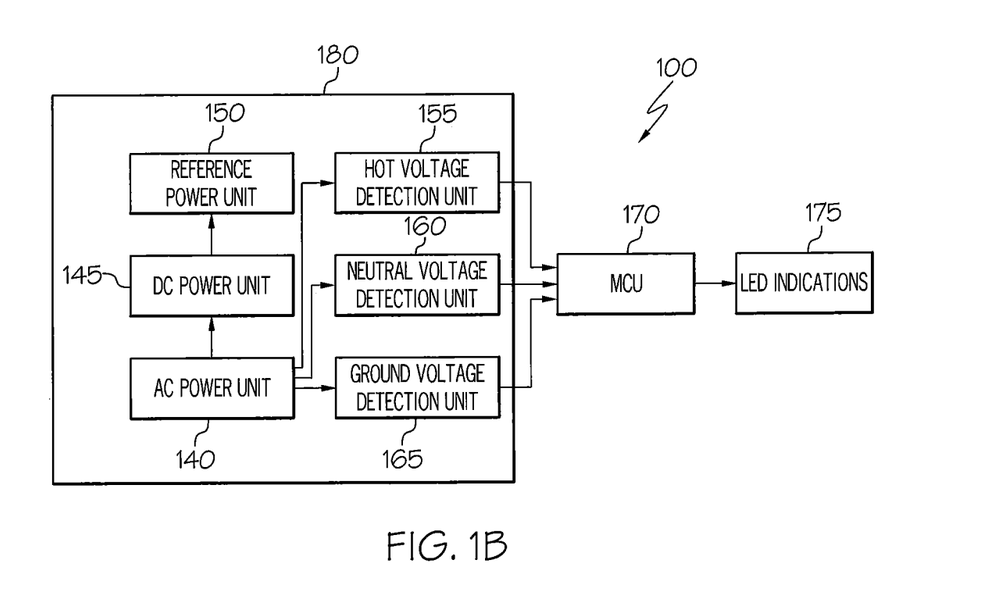
FIG. 1B is a block diagram of the electronic circuit of FIG. 1A, according to various embodiments described herein.

FIG. 1B is a block diagram of the electronic device of FIG. 1A. Referring now to FIG. 1B, an electronic device 100, such as a connector, may include fault detection circuitry 180 that provides fault indications to a microcontroller unit (MCU) 170, which in turn, controls visual fault indicators such as LED indications 175. LED indications 175 may correspond to the LEDs 125, 130, and/or 135 of FIG. 1A.

Still referring to FIG. 1B, the fault detection circuitry may include an AC power unit 140 that receives AC power signals from an AC power source that may be external to the electronic device 100. The fault detection circuitry 180 may include a DC power unit 145. The DC power unit provides a DC power source to the fault detection circuitry 180. In some embodiments, the DC reference power may be generated from the AC power signals that are received by the AC power unit 140 in the electronic device 100. A reference power unit 150 may generate a reference signal based on a DC power source from the DC power unit 145. This reference signal from reference power unit 150 may be used as a voltage reference signal by circuitry in the electronic device 100. The AC power signals from the AC power unit 140 may include an AC input power signal, an AC neutral power signal, and/or an AC ground power signal. These AC power signals may be input into the hot voltage detection unit 155, the neutral voltage detection unit 160, and the ground voltage detection unit 165, respectively. The hot voltage detection unit 155 may output a first fault indication signal, which may be referred to as a hot fault indication signal. The neutral voltage detection unit 160 may output a second fault indication signal, which may be referred to as a neutral fault indication signal. The ground voltage detection unit 165 may output a third fault indication signal, which may be referred to as a ground fault indication signal. The first, second, and/or third fault indication signals may be provided to the microcontroller unit 170. The microcontroller unit may control the status of the LED indications 175 based on the first, second, and/or third fault indication signals.

Figure 2:
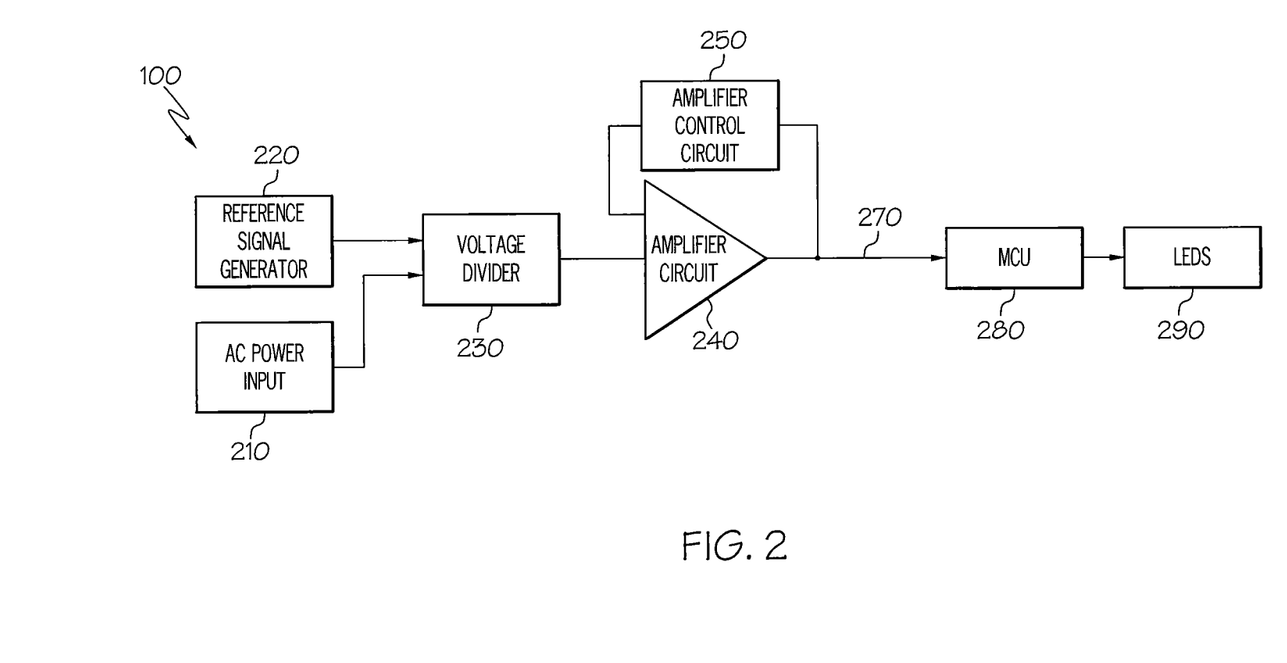
FIG. 2 is block diagram of an electronic circuit to detect faults, according to various embodiments described herein.

FIG. 2 is block diagram of a electronic device to detect faults. Referring now to FIG. 2, the electronic device 100 may receive an AC input power signal at block 210 from an AC power unit. The AC power input 210 may include a terminal coupled to the connector of housing 105 of FIG. 1A. The AC input power signal may be input to a voltage divider 230 that receives a reference signal from reference signal generator 220. The voltage divider 230 may scale the reference signal for application to the AC input power signal to generate a divided AC input power signal. The divided AC input power signal may be input to an amplifier circuit 240.

The amplifier circuit 240 is controlled by an amplifier control circuit 250 that controls the DC voltage level of the fault indication signal 270 that is output by the amplifier circuit 240. The fault indication signal 270 is input to a microcontroller unit 280 that controls one or more LEDs 290. Control of LEDs 290 may include control of the illumination and/or color of illumination of one or more LEDs.

Figure 3:
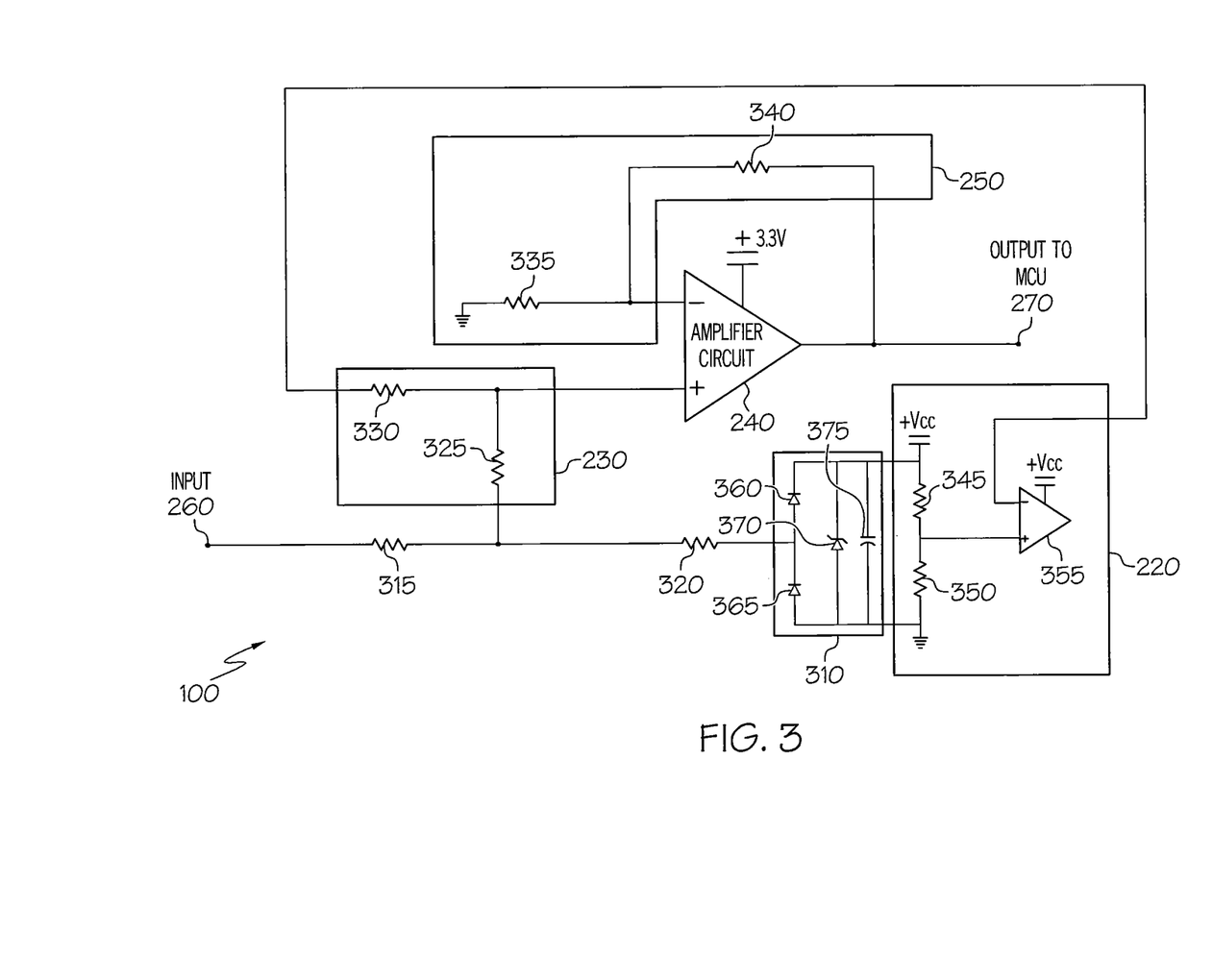
FIGS. 3 and 4 are circuit diagrams of the electronic circuits of FIG. 1B and/or FIG. 2, according to various embodiments described herein.

FIG. 3 is a circuit diagram of the electronic device 100 of FIG. 1B, and/or the electronic device 100 of FIG. 2. Referring now to FIG. 3, an input signal passes through current limiting element 315 and/or a current limiting element 320 to a DC generator circuit 310 that generates a DC power source $V_{CC}$. The DC generator circuit 310 may include a full wave rectifier including diodes 360 and 365. The full wave rectified signal may be converted to a DC power source $V_{CC}$ after passing across Zener diode 370 and capacitive element 375. Capacitive element 375 provides noise immunity and stores energy to provide for stability to the DC power source $V_{CC}$. In this way, the DC power source $V_{CC}$ is derived from the AC power input by the DC generator circuit 310. The DC power source $V_{CC}$ is input to the reference signal generator circuit 220. The reference signal that is output from the reference signal generator 220 may be based on a voltage divider that includes divider elements 345 and 350. For example, if the DC power source $V_{CC}$ is 3.3V, and if divider elements 345 and 350 each have a resistance value equal to one another, the reference signal would be scaled to be half of DC power source $V_{CC}$, resulting in reference signal with a voltage of 1.65V. The signal that is voltage dropped across divider element 345 is input to the operational amplifier 355, which is configured as a voltage follower amplifier such that the output follows the input. The output of operational amplifier 355 is tied to the '-' input of the operational amplifier 355 to achieve the voltage follower functionality. The output of the reference signal generator 220 is provided as an input to the voltage divider circuit 230. The voltage divider circuit 230 may include divider elements 330 and/or 325 that scale the reference signal for application to the AC input power signal for providing to an amplifier circuit 240. An amplifier control circuit 250 may include amplification elements 335 and/or 340 that determine the amplification of the amplifier circuit 240. The output 270 of the amplifier circuit 240 may be provided to a microcontroller, such as MCU 280 of FIG. 2.

Figure 4:
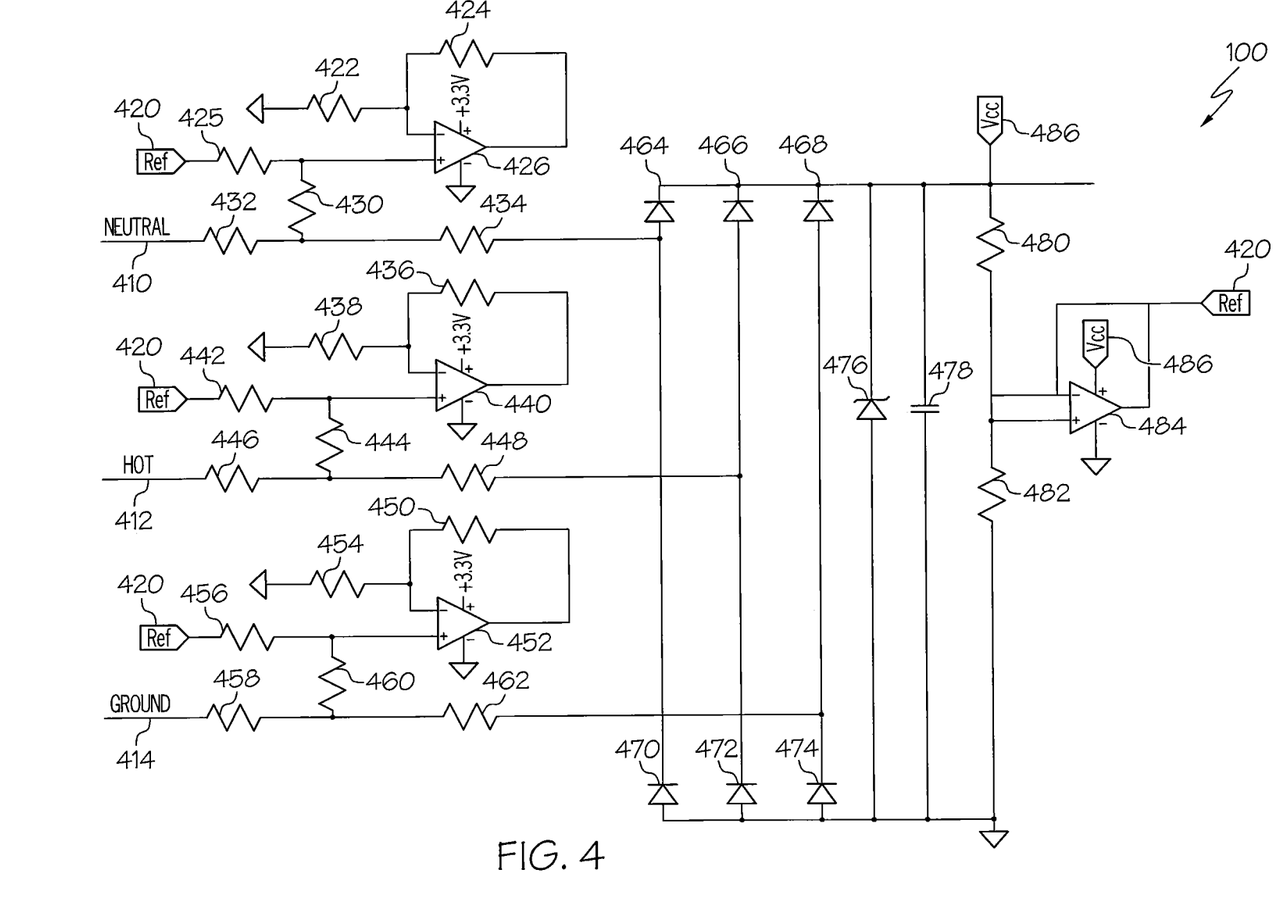

FIG. 4 is a circuit diagram of the electronic device of FIG. 1B to FIG. 3. Referring now to FIG. 4, an AC power unit may be connected to the electronic device 100 to supply an AC input power signal at hot terminal 412, an AC neutral power signal at neutral terminal 410, and/or an AC ground power signal at ground terminal 414. Resistors 432, 446, and 458 serve to limit the current from the AC power unit of the respective AC input power signal, neutral power signal, and the ground power signal. The current from the AC power unit may be further limited by resistors 434, 448, and 462 before feeding the AC power signals to respective full wave rectifiers that include diodes 464 and 470, 466 and 472, and 468 and 474, respectively. The resulting rectified power signal is dropped across a Zener diode 476 and capacitor 478 to produce the DC power source. Capacitor 478 may provide noise immunity and store energy to provide stability to the DC power source $V_{CC}$ 486 that is generated. DC power source $V_{CC}$ 486 may be divided by resistors 480 and 482 for input into the voltage follower operational amplifier 484 that outputs a reference signal 420 that is based on the DC power source $V_{CC}$ 486.

Still referring to FIG. 4, reference signal 420 is used as an input to voltage divider circuits that includes resistors 428 and 430, 442 and 444, and 456 and 460, respectively, and are used to scale the respective AC input power signal, neutral power signal, and the ground power signal. The scaled AC input power signal, scaled neutral power signal, and the scaled ground power signal are input to amplifiers 426, 440, and 452, respectively. Amplifiers 426, 440, and 452 output fault indication signals. Resistor groups 422 and 424, 438 and 436, and 454 and 450, respectively, are used to control the fault indication signal levels of amplifiers 426, 440, and 452. The respective outputs of amplifiers 426, 440, and 452 provide fault indication signals that may be input to a microcontroller to determine various types of faults detected the electronic device 100.

Figure 5:
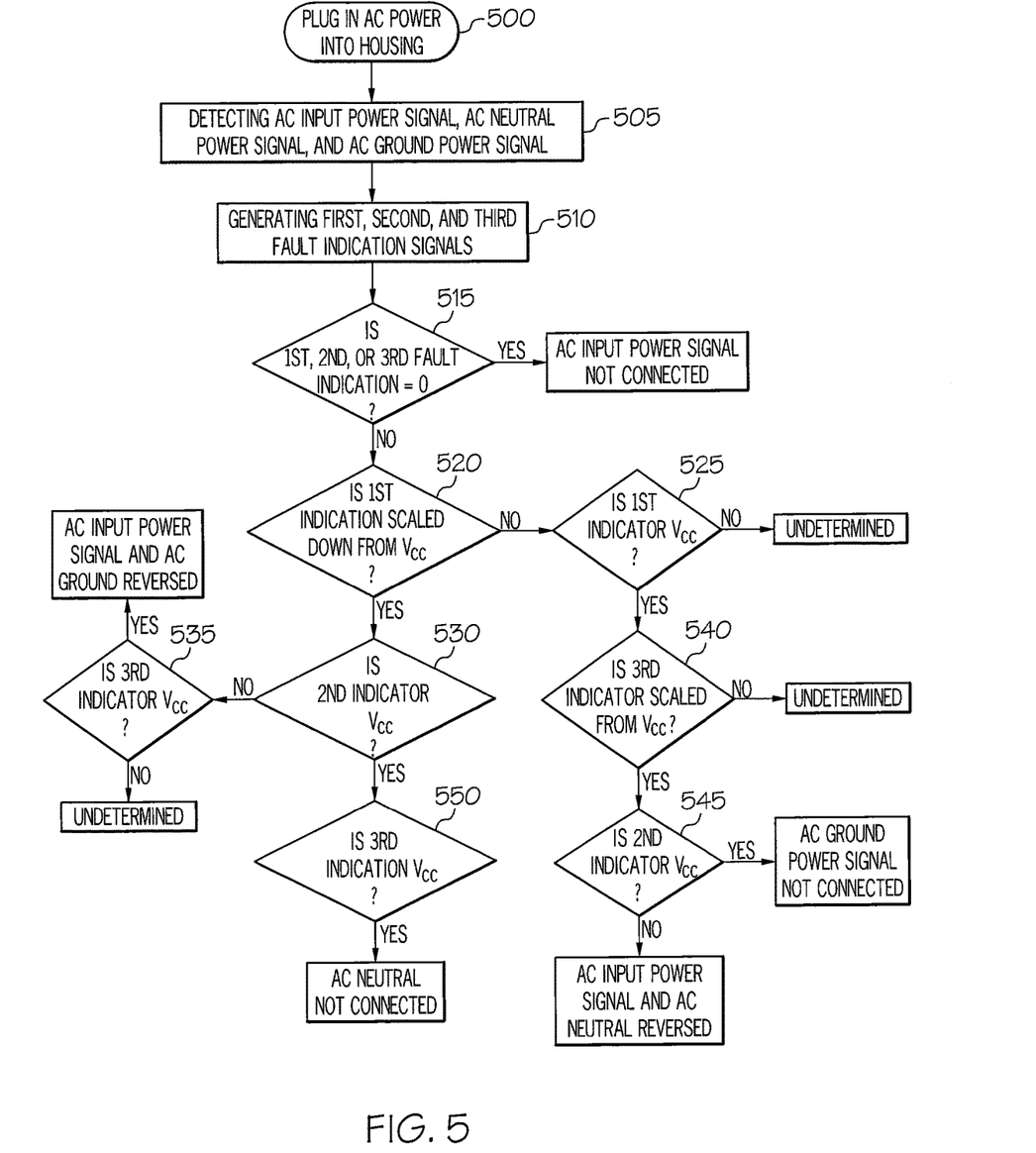
FIG. 5 is a flowchart of operations to indicate faults in the electronic circuit of FIGS. 1A to 4, according to various embodiments described herein.

FIG. 5 is a flowchart of operations to indicate faults in the AC power connections by the electronic circuit of FIGS. 1A to 4, according to various embodiments described herein. Referring now to FIG. 5, a connector including the AC power signals may be plugged into the housing 105 of FIG. 1A such that an AC power unit is coupled to the electronic device, at block 500. The AC input power signal, the AC neutral power signal, and the AC ground power signal maybe detected by the circuits of FIG. 2 and/or FIG. 3, at block 505. First, second, and third fault indication signals are generated at block 510, by the output of the amplifier circuit 240 of FIG. 2 and/or FIG. 3. These fault indication signals may be provided to a microcontroller in order to evaluate the specific type of fault that has occurred at the connector associated with the electronic device. If the first, second, or third fault indication signals have a signal voltage of 0 V, it is determined that the AC input power signal is not connected, at block 515. If these fault indication signals have a signal voltage that is greater than 0 V, then a check is performed to determine if the first fault indication signal is scaled down from $V_{CC}$, at block 520. In some embodiments, $V_{CC}$ may be the DC supply voltage from the DC power source, which may be derived from the AC input power signal. In some embodiments, $V_{CC}$ may be a fixed DC voltage, such as 3.3V. If the first fault indication signal is determined to be scaled down from $V_{CC}$, then a check is performed to determine if the second fault indication signal is equal to $V_{CC}$, at block 530. If this check at block 530 is not true, a check is performed to see if the third fault indication signal is equal to $V_{CC}$, at block 535. If the check at block 535 is not true, then the existence of a fault in the AC power signals is indeterminate. However, if the third fault indication signal is equal to $V_{CC}$ at block 535, then the system may indicate that the AC input power signal and the AC ground signal are reversed.

Once again referring to block 520 of FIG. 5, if the first fault indication signal is not scaled down from $V_{CC}$, a check is performed if the first fault indication signal is equal to $V_{CC}$, at block 525. If the first fault indication signal is not equal to $V_{CC}$, then the faults in the AC input are indeterminate. If the first fault indication signal is equal to $V_{CC}$, then a check is performed to determine if the third fault indication signal is scaled from $V_{CC}$, at block 540. If the third fault indication signal is not equal to $V_{CC}$, then the faults in the AC input are indeterminate. If the third fault indication signal is scaled from $V_{CC}$ at block 540, then a check is performed if the second fault indication signal is equal to $V_{CC}$, at block 545. If the second fault indication signal is equal to $V_{CC}$, at block 545, then it may be determined that the AC ground power signal is not connected. If the second fault indication signal is not equal to $V_{CC}$, at block 545, then it may be determined that the AC input power signal and the AC neutral power signal are reversed.

Referring once again to block 530 of FIG. 5, if the second fault indication signal is equal to $V_{CC}$, then a check is performed at block 550 to determine if the third fault indication signal is equal to $V_{CC}$. If the third fault indication signal is equal to $V_{CC}$ at block 550, then it is determined that the AC neutral terminal is not connected. If it is determined that the third fault indication signal is not equal to $V_{CC}$, at block 550, then it is determined that the power signals have been correctly applied and thus no faults have occurred.

Figure 6A:
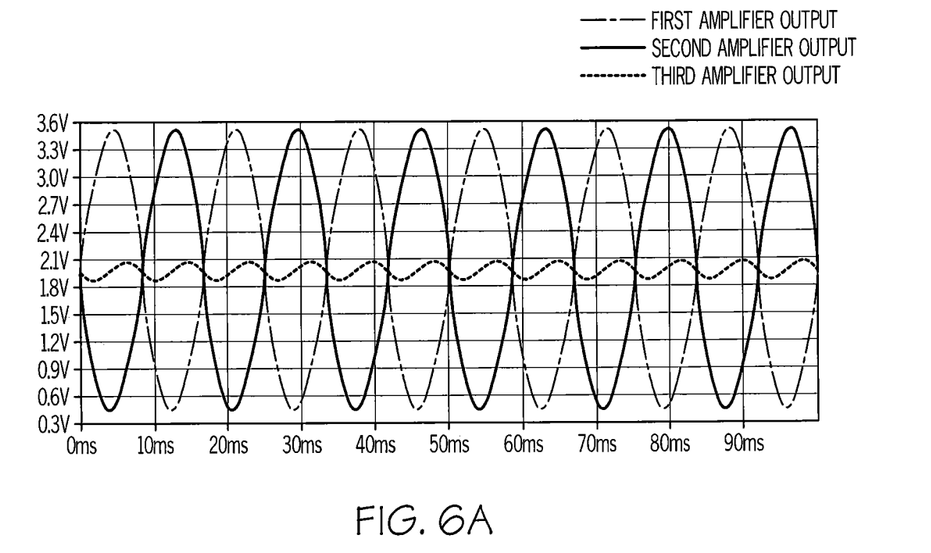
FIGS. 6A to 6E are signal diagrams of the electronic circuits of FIGS. 1A to 4, according to various embodiments described herein.

FIGS. 6A to 6E are signal diagrams of the fault indication signals output from the electronic circuits of FIGS. 1 to 4, according to various embodiments described herein. Referring now to FIG. 6A, a signal diagram of a case where the AC ground power signal is open circuited, i.e., not connected. The first fault indication signal, output from amplifier 440 of FIG. 4, and the second fault indication signal, output from amplifier 426 of FIG. 4, have a peak voltage equal to the reference signal voltage $V_{CC}$. The third fault indication signal, output from amplifier 452 of FIG. 4, has a peak scaled voltage that is scaled down from the reference signal voltage $V_{CC}$. In this example, the peak reference signal voltage $V_{CC}$ is 3.5 V and the peak scaled voltage is 2.1 V. This combination of peak voltages of the fault indication signals indicates that the AC ground power signal is open circuited.

Figure 6B:
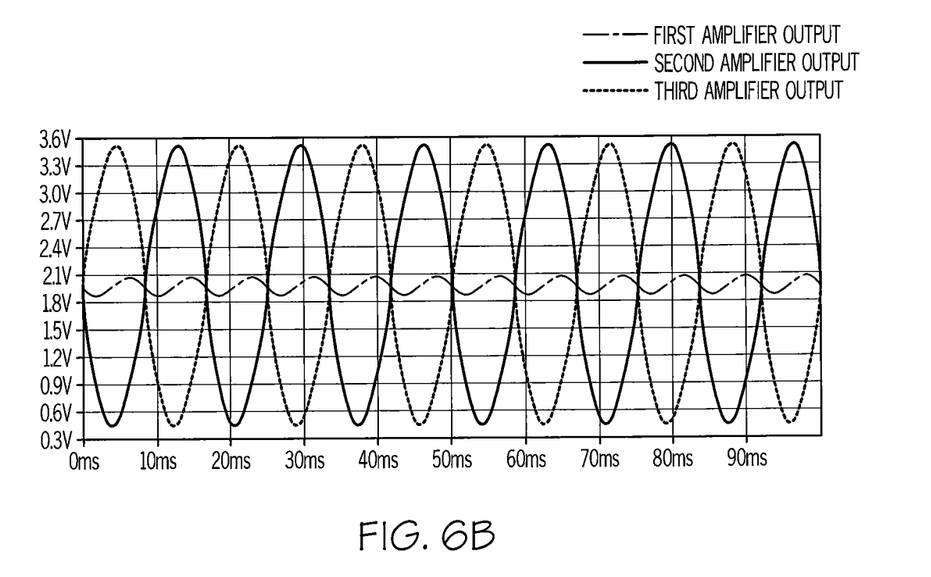

Referring now to FIG. 6B, a signal diagram of a case where the AC neutral power signal is open circuited, i.e., not connected. The third fault indication signal, output from amplifier 452 of FIG. 4, and the second fault indication signal, output from amplifier 426 of FIG. 4, have a peak voltage equal to the reference signal voltage $V_{CC}$. The first fault indication signal, output from amplifier 440 of FIG. 4, has a peak scaled voltage that is scaled down from the reference signal voltage $V_{CC}$. In this example, the peak reference signal voltage $V_{CC}$ is 3.5 V and the peak scaled voltage is 2.1 V. This combination of peak voltages of the fault indication signals indicates that the AC neutral power signal is open circuited.

Figure 6C:
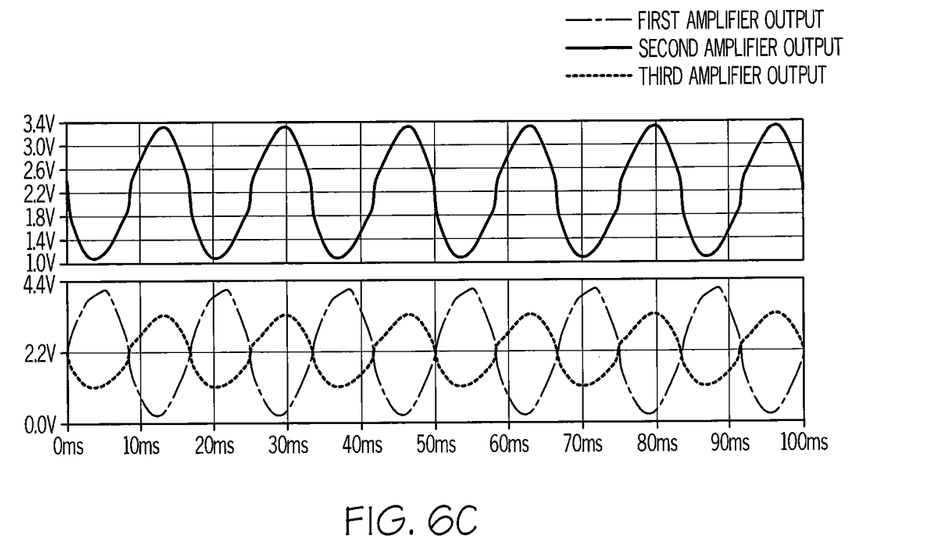

Referring now to FIG. 6C, a signal diagram of a case where the AC power signal (i.e., "hot") and the AC neutral power signal are reversed, i.e., the connections are interchanged. The first fault indication signal, output from amplifier 440 of FIG. 4, has a peak voltage of the DC power source voltage. The second fault indication signal, output from amplifier 426 of FIG. 4, has a peak voltage equal to the reference signal voltage $V_{CC}$. The third fault indication signal, output from amplifier 452 of FIG. 4, has a peak scaled voltage that is scaled down from the reference signal voltage $V_{CC}$. In this example, the peak reference signal voltage $V_{CC}$ is 3.5 V and the peak scaled voltage is 2.1 V. This combination of peak voltages of the fault indication signals indicates that the AC power signal (i.e., "hot") and the AC neutral power signal are reversed.

Figure 6D:
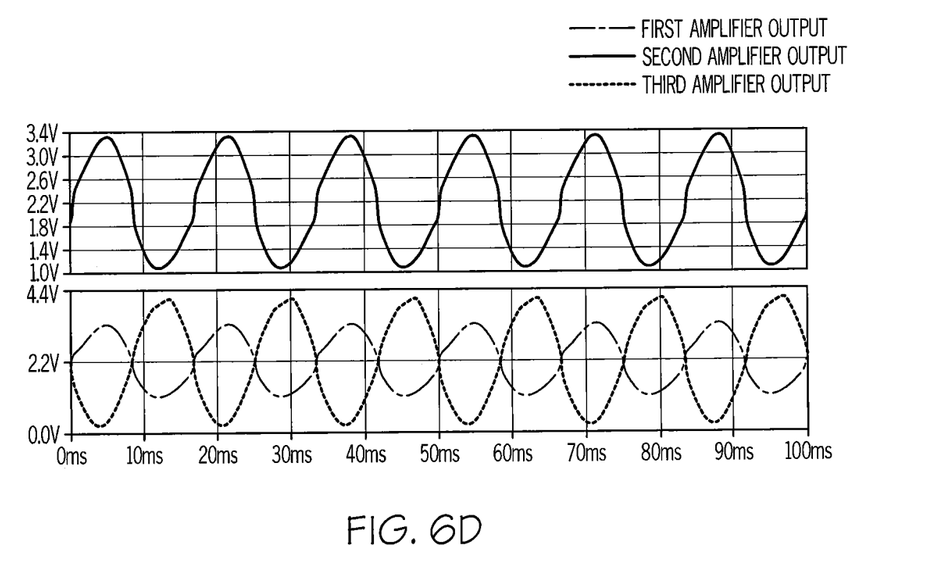

Referring now to FIG. 6D, a signal diagram of a case where the AC power signal (i.e., "hot") and the AC ground power signal are reversed, i.e., the connections are interchanged. The first fault indication signal, output from amplifier 440 of FIG. 4, has a peak scaled voltage that is scaled down from the reference signal voltage $V_{CC}$. The second fault indication signal, output from amplifier 426 of FIG. 4, has a peak voltage that is scaled down from the reference signal voltage $V_{CC}$. The DC power source voltage is 4.4 V. The third fault indication signal, output from amplifier 452 of FIG. 4, has a peak scaled voltage that is the peak voltage of the DC power source voltage. In this example, the peak reference signal voltage $V_{CC}$ is 3.5 V and the peak scaled voltage is 2.1 V. In this example embodiment, the DC power source voltage is 4.4 V. This combination of peak voltages of the fault indication signals indicates that the AC power signal (i.e., "hot") and the AC ground power signal are reversed.

Figure 6E:
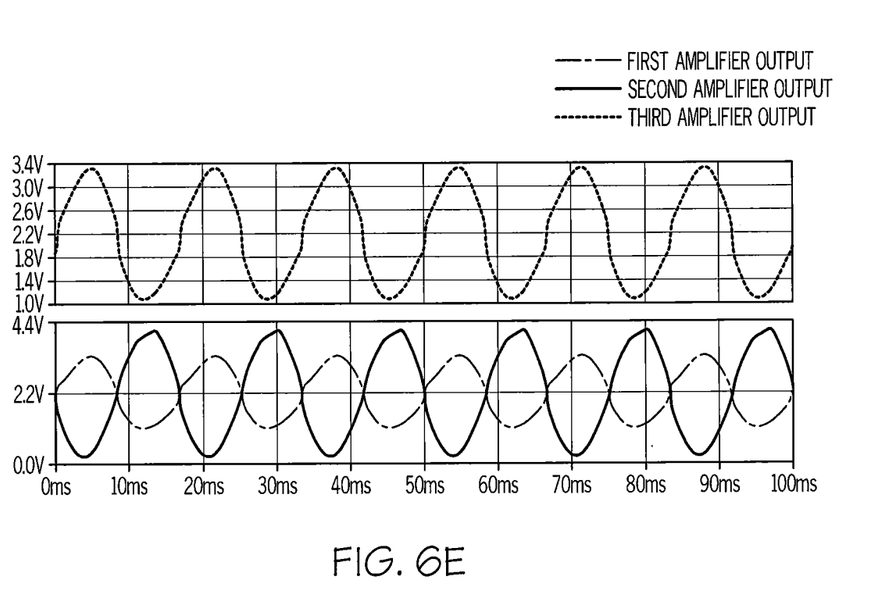

Referring now to FIG. 6E, a signal diagram where all three of the AC input power signal, the AC neutral power signal, and the AC ground power signal are properly connected is shown. The first fault indication signal, output from amplifier 440 of FIG. 4, has a peak scaled voltage that is scaled down from the reference signal voltage $V_{CC}$. The second fault indication signal, output from amplifier 426 of FIG. 4, has a peak scaled voltage that is the peak voltage of the DC power source voltage. The third fault indication signal, output from amplifier 452 of FIG. 4, has a peak scaled voltage that is scaled down from the reference signal voltage $V_{CC}$. In this example, the peak reference signal voltage $V_{CC}$ is 3.3 V and the peak scaled voltage is 3.0 V. In this example embodiment, the DC power source voltage is 4.4 V. This combination of peak voltage of the fault indication signal indicates that all three of the AC input power signal, the AC neutral power signal, and the AC ground power signal are properly connected.

Figure 7:
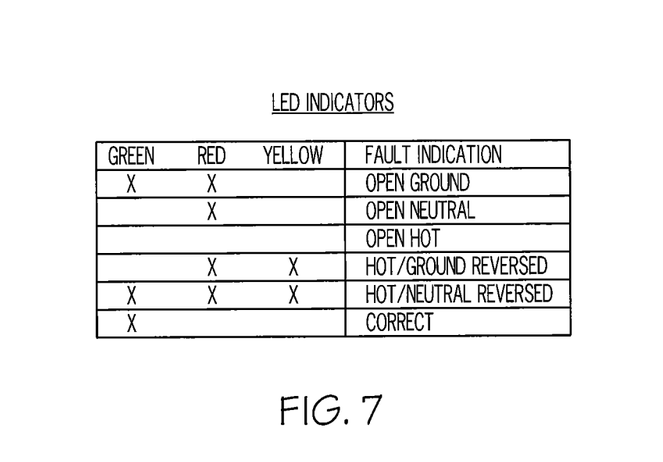
FIG. 7 is a table of LED indicator combinations for fault indication, according to various embodiments described herein.

FIG. 7 is a table of LED indicator combinations for fault indications, according to various embodiments described herein. These LED indicators are illuminated in various combinations based on the previously described fault indication signals. For example, the green and red LEDs may be illuminated if an open AC ground power signal is detected. The red LED may be illuminated if an open AC neutral power signal is detected. If the AC input power signal (i.e., "hot") is open circuited, none of the LED indicators may be illuminated. The red and yellow LEDs may be illuminated if the AC input power signal (i.e., "hot") and AC neutral power signal are reversed. The green, red, and yellow LEDs may be illuminated if the AC input power signal (i.e., "hot") and the AC neutral power signal are reversed. The green LED may be illuminated to indicate that all three of the power signals are correctly connected. These LEDs may be located on the housing 105 of FIG. 1A such that when the power is connected, the user may easily observe the status of the power signals. Additionally, the electronic circuit may include a switch in the housing 105 that is configured to interrupt the connection between the AC power unit and the load based on one or more of the fault indication signals and/or fault conditions. This switch would thus protect the load from damage due to an incorrect power connection. Interrupting the connection between the AC power unit and the load may include providing an open circuit between the AC input power signal, the AC neutral power signal, and/or the AC neutral power signal and the respective terminal of the load. Interrupting the connection may include grounding the power inputs such that current is not driven into load. Other power interruption mechanisms may be implemented by the switch in the context of the inventive concepts.

Figure 8:
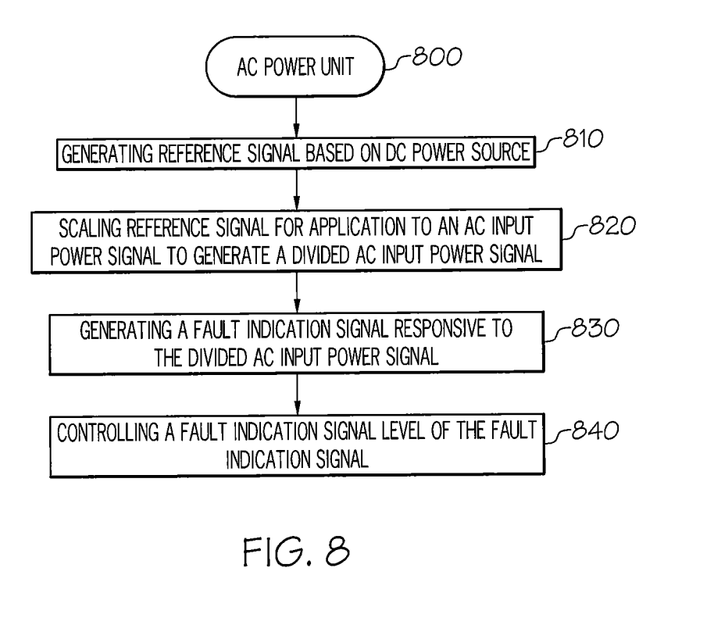
FIG. 8 is a flowchart of operations for detecting faults in an AC power connector, according to various embodiments described herein.

FIG. 8 is a flowchart of operations for detecting faults in an AC power connector, according to various embodiments described herein. Referring now to FIG. 8, an AC power unit may be connected to the electronic device described herein, at block 800. A reference signal may be generated based on the DC power source, at block 810. The reference signal may be scaled for application to an AC input power signal to generate a divided AC input power signal, at block 820. A fault indication signal may be generated, responsive to the divided AC input power signal, at block 830. A fault indication signal level of the fault indication signal that is provided to a microcontroller may be controlled, at block 840.

Figure 9:
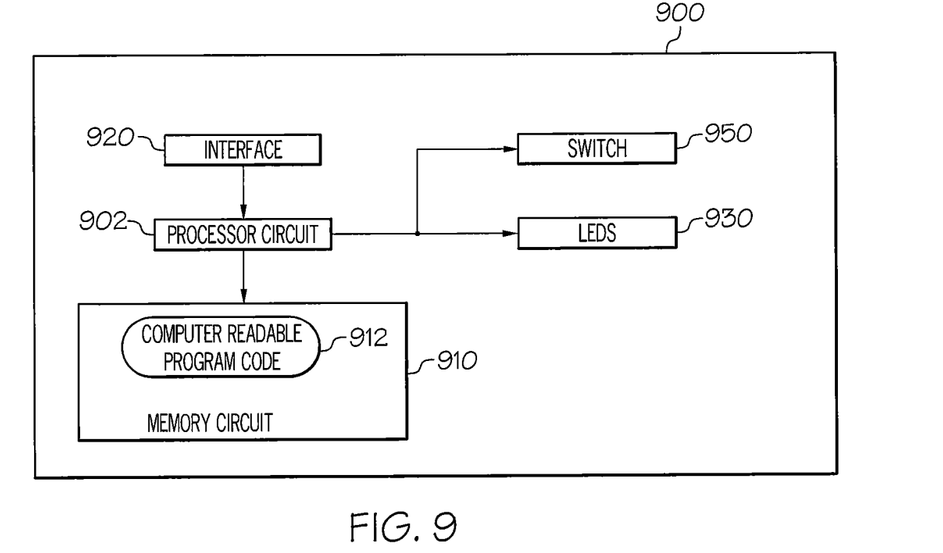
FIGS. 9 and 10 are block diagrams of an electronic device, according to various embodiments described herein.

FIG. 9 is a block diagram of an electronic device 900, such as the connector 100 of FIG. 1A. The electronic device 900 may be integrated with the connector 100 of FIG. 1A and/or may be external to the connector and is configured to perform operations according to one or more embodiments disclosed herein. Referring to FIG. 9, the electronic device 900 includes a LEDs 930, a processor circuit 902, and a memory circuit 910 containing computer readable program code 912. The processor circuit 902 may include one or more data processing circuits, such as a general purpose and/or special purpose processor, e.g., microprocessor and/or digital signal processor, that may be collocated with the electronic device 900 or distributed across one or more networks with communication to the electronic device 900. The processor circuit 902 is configured to execute the computer readable program code 912 in the memory 910 to perform at least some of the operations and methods of described herein as being performed by the electronic device 900. The interface 920 is coupled to the processor circuit 902 and may be connected with an AC power unit, directly or indirectly.

Figure 10:
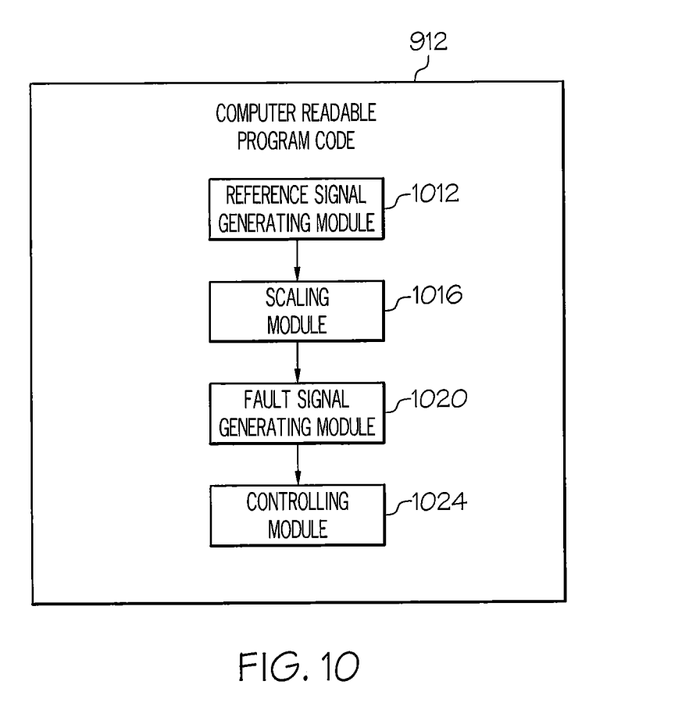

FIG. 10 illustrates modules for an electronic device that perform operations as disclosed herein according to some embodiments. The computer readable program code 912 of FIG. 9 may include one or more modules. Referring now to FIG. 10, the computer readable program code 912 may include a reference signal generating module 1012, a scaling module 1016, a fault signal generating module 1020, and/or a controlling module 1024. The reference signal generating module 1012 is for generating a reference signal based on a DC power source (block 810 of FIG. 8). The scaling module 1016 is for scaling the reference signal for application to an AC input power signal to generate a divided AC input power signal (block 820 of FIG. 8). The fault signal generating module 1020 is for generating a fault indication signal responsive to the divided AC input power signal (block 830 of FIG. 8). The controlling module 1024 is for controlling a fault indication signal level of the fault indication signal, as described with respect to block 840 of FIG. 8. The modules 1012, 1016, 1020, and 1024 may perform other corresponding operations and methods disclosed herein.

Various embodiments presented herein have described an electronic device that may be integrated with a power connector to indicate incorrect AC power connections with issues as such open terminals or interchanged power terminals. The techniques for detection of incorrect AC power connections described herein provide an efficient and convenient solution for protecting electrical loads from harmful effects of incorrect power connections.

Further Definitions

In the above-description of various embodiments of the present disclosure, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art, and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-Ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present disclosure may be embodied in hardware and/or in software (including firmware, resident software, microcode, etc.) that runs on a processor such as a digital signal processor, which may collectively be referred to as "circuitry," "a module" or variants thereof.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination. Many variations and modifications can be made to the embodiments without substantially departing from the principles of the present invention. All such variations and modifications are intended to be included herein within the scope of the present invention.

The invention claimed is:

1. An electronic device that is configured to be coupled to an alternating current (AC) power unit that comprises an AC input power signal, the electronic device comprising:
a reference signal generator circuit that is configured to generate a reference signal based on a direct current (DC) power source;
a voltage divider circuit that is configured to scale the reference signal for application to the AC input power signal to generate a divided AC input power signal;
an amplifier circuit that is configured to output a fault indication signal responsive to the divided AC input power signal;
an amplifier control circuit that is coupled to the amplifier circuit and is configured to control a fault indication signal level of the fault indication signal that is output by the amplifier circuit; and
a current limiting circuit configured to limit a current of the AC input power signal before the AC input power signal is applied to the voltage divider circuit.

2. An electronic device that is configured to be coupled to an alternating current (AC) power unit that comprises an AC input power signal, an AC neutral power signal and an AC ground power signal, the electronic device comprising:
a reference signal generator circuit that is configured to generate a reference signal based on a direct current (DC) power source;
a first voltage divider circuit that is configured to scale the reference signal for application to the AC input power signal to generate a divided AC input power signal;
a first amplifier circuit that is configured to output a first fault indication signal responsive to the divided AC input power signal;
a first amplifier control circuit that is coupled to the first amplifier circuit and is configured to control a first fault indication signal level of the first fault indication signal that is output by the first amplifier circuit;
a second voltage divider circuit configured to scale the reference signal for application to the AC neutral power signal to generate a divided AC neutral power signal;
a third voltage divider circuit configured to scale the reference signal for application to the AC ground power signal to generate a divided AC ground power signal;
a second amplifier circuit that is configured to output a second fault indication signal responsive to the divided AC neutral power signal;
a third amplifier circuit that is configured to output a third fault indication signal responsive to the divided AC ground power signal;
a second amplifier control circuit that is coupled to the second amplifier circuit and is configured to control a second fault indication signal level of the second fault indication signal that is output by the second amplifier circuit; and
a third amplifier control circuit that is coupled to the third amplifier circuit and is configured to control a third fault indication signal level of the third fault indication signal that is output by the third amplifier circuit.

3. The electronic device of claim 2, further comprising:
a microcontroller configured to control visual fault indications based on the first fault indication signal level, the second fault indication signal level, and the third fault indication signal level.

4. The electronic device of claim 3, wherein the visual fault indications indicate that at least one of:
the AC input power signal is not connected;
the AC neutral power signal is not connected;
the AC ground power signal is not connected;
the AC input power signal and the AC neutral power signal are interchanged; or
the AC input power signal and the AC ground power signal are interchanged.

5. The electronic device of claim 2, further comprising:
a housing comprising an interface to the AC power unit; and
a plurality of Light Emitting Diodes (LEDs) configured to be illuminated based on one or more of the first fault indication signal, the second fault indication signal, and the third fault indication signal.

6. The electronic device of claim 2, further comprising:
a switch configured to interrupt a connection between the AC power unit and a load, based on one or more of the first fault indication signal, the second fault indication signal, and the third fault indication signal.

7. An electronic device that is configured to be coupled to an alternating current (AC) power unit that comprises an AC input power signal, the electronic device comprising:
a reference signal generator circuit that is configured to generate a reference signal based on a direct current (DC) power source;
a voltage divider circuit that is configured to scale the reference signal for application to the AC input power signal to generate a divided AC input power signal;
an amplifier circuit that is configured to output a fault indication signal responsive to the divided AC input power signal; and
an amplifier control circuit that is coupled to the amplifier circuit and is configured to control a fault indication signal level of the fault indication signal that is output by the amplifier circuit;
wherein the reference signal generator circuit comprises a DC-to-DC power converter configured to convert the DC power source to a scaled voltage source that is input into a reference amplifier configured as a voltage follower to output the reference signal.

8. The electronic device of claim 7, further comprising:
a full wave rectifier configured to generate the DC power source from the AC input power signal.

9. A method of operating an electronic device that is configured to be coupled to an alternating current (AC) power unit, the method comprising:
generating a reference signal based on a direct current (DC) power source;
scaling the reference signal for application to an AC input power signal from the AC power unit to generate a divided AC input power signal;
generating a fault indication signal responsive to the divided AC input power signal;
controlling a fault indication signal level of the fault indication signal; and
limiting a current of the AC input power signal before the scaling the reference signal.

10. A method of operating an electronic device that is configured to be coupled to an alternating current (AC) power unit, the method comprising:
generating a reference signal based on a direct current (DC) power source;
scaling the reference signal for application to an AC input power signal from the AC power unit to generate a divided AC input power signal;
generating a first fault indication signal responsive to the divided AC input power signal;
controlling a first fault indication signal level of the first fault indication signal;

scaling the reference signal for application to an AC neutral power signal from the AC power unit to generate a divided AC neutral power signal;

scaling the reference signal for application to an AC ground power signal to generate a divided AC ground power signal;

generating a second fault indication signal responsive to the divided AC neutral power signal;

generating a third fault indication signal responsive to the divided AC ground power signal;

controlling a second fault indication signal level of the second fault indication signal; and controlling a third fault indication signal level of the third fault indication signal.

11. The method of claim 10, further comprising:
controlling visual fault indications based on the first fault indication signal level, the second fault indication signal level, and the third fault indication signal level.

12. The method of claim 11, wherein the visual fault indications indicate that at least one of:
the AC input power signal is not connected;
the AC neutral power signal is not connected;
the AC ground power signal is not connected;
the AC input power signal and the AC neutral power signal are interchanged; or
the AC input power signal and the AC ground power signal are interchanged.

13. The method of claim 10, further comprising:
controlling a plurality of Light Emitting Diodes (LEDs) based on one or more of the first fault indication signal, the second fault indication signal, and the third fault indication signal.

14. The method of claim 10, further comprising:
interrupting a connection between the AC power unit and a load, based on one or more of the first fault indication signal, the second fault indication signal, and the third fault indication signal.

15. A method of operating an electronic device that is configured to be coupled to an alternating current (AC) power unit, the method comprising:
generating a reference signal based on a direct current (DC) power source;

scaling the reference signal for application to an AC input power signal from the AC power unit to generate a divided AC input power signal;

generating a first fault indication signal responsive to the divided AC input power signal; and controlling a first fault indication signal level of the first fault indication signal, wherein the generating the reference signal comprises:
converting the DC power source to a scaled voltage source that is input into a reference amplifier configured as a voltage follower to output the reference signal.

16. The method of claim 15, further comprising:
generating the DC power source by applying a full wave rectifier to the AC input power signal.

17. A computer program product comprising a tangible non-transitory computer readable storage medium having computer readable program code embodied therein that, when executed by at least one processor, causes the at least one processor to perform the operations of claim 9.

18. An electronic device that is configured to be coupled to an alternating current (AC) power unit that comprises an AC input power signal, an AC neutral power signal, and an AC ground power signal, the electronic device comprising:
a housing comprising an interface to the AC power unit;
a reference signal generator circuit that is configured to generate a reference signal based on a direct current (DC) power source;
a voltage divider circuit that is configured to scale the reference signal for application to the AC input power signal, the AC neutral power signal, and/or the AC ground power signal to generate divided AC power signals;
an amplifier circuit that is configured to output fault indication signals responsive to the divided AC power signals;
an amplifier control circuit that is configured to control fault indication signal levels of the fault indication signals that are output by the amplifier circuit; and
a plurality of Light Emitting Diodes (LEDs) coupled to the housing, wherein the plurality of LEDs are controlled based on the fault indication signals.

* * * * *

UNITED STATES PATENT AND TRADEMARK OFFICE
CERTIFICATE OF CORRECTION

PATENT NO. : 10,727,663 B2
APPLICATION NO. : 15/716584
DATED : July 28, 2020
INVENTOR(S) : Yang et al.

Page 1 of 1

It is certified that error appears in the above-identified patent and that said Letters Patent is hereby corrected as shown below:

In the Claims

Column 14, Line 33, Claim 7: Please correct "circuit;" to read -- circuit, --

Signed and Sealed this
Twenty-second Day of December, 2020

Andrei Iancu
*Director of the United States Patent and Trademark Office*